(12) United States Patent
Higuchi et al.

(10) Patent No.: US 6,984,843 B2
(45) Date of Patent: Jan. 10, 2006

(54) BOARD FOR ELECTRONIC DEVICE, ELECTRONIC DEVICE, FERROELECTRIC MEMORY, ELECTRONIC APPARATUS, INK-JET RECORDING HEAD, AND INK-JET PRINTER

(75) Inventors: Takamitsu Higuchi, Matsumoto (JP); Setsuya Iwashita, Nirasaki (JP); Hiromu Miyazawa, Toyoshina-machi (JP)

(73) Assignee: Seiko Epson Corporation, (JP)

( * ) Notice: Subject to any disclaimer, the term of this patent is extended or adjusted under 35 U.S.C. 154(b) by 0 days.

(21) Appl. No.: 10/396,732

(22) Filed: Mar. 25, 2003

(65) Prior Publication Data

US 2003/0218644 A1 Nov. 27, 2003

(30) Foreign Application Priority Data

Mar. 25, 2002 (JP) ............................ 2002-084327
Feb. 21, 2003 (JP) ............................ 2003-044370

(51) Int. Cl.
  H01L 29/06 (2006.01)
  B41J 2/045 (2006.01)
(52) U.S. Cl. .......................... 257/16; 257/52; 257/54; 257/646; 347/68
(58) Field of Classification Search .................. 257/13, 257/79–103, 918, 295, 751, 16, 52, 646, 257/54; 438/22, 24, 25, 28, 29, 46, 57, 257, 438/3, 240, 627, 928, 977; 347/68, 70, 71; 216/2, 16, 27, 56, 99
See application file for complete search history.

(56) References Cited

U.S. PATENT DOCUMENTS

| 5,650,378 | A | | 7/1997 | Iijima et al. |
| 5,801,105 | A | | 9/1998 | Yano et al. |
| 5,838,035 | A | * | 11/1998 | Ramesh ....................... 257/295 |
| 6,258,472 | B1 | * | 7/2001 | Neumuller et al. ......... 428/701 |
| 6,303,042 | B1 | * | 10/2001 | Hawkins et al. .............. 216/27 |
| 6,555,946 | B1 | * | 4/2003 | Finder et al. ................. 310/324 |
| 6,563,118 | B2 | * | 5/2003 | Ooms et al. .............. 250/338.3 |
| 6,737,690 | B2 | * | 5/2004 | Higuchi et al. ............. 257/295 |
| 6,747,317 | B2 | * | 6/2004 | Kondo et al. ............... 257/347 |
| 6,869,170 | B2 | * | 3/2005 | Shimada et al. ............. 347/68 |
| 2002/0082171 | A1 | * | 6/2002 | Schoop et al. .............. 505/100 |

FOREIGN PATENT DOCUMENTS

JP 06-145977 5/1994

(Continued)

OTHER PUBLICATIONS

Hontsu et al. , Al Films layers for High-Temperature Superconducting Thin Films on Amorphous Substrates, IEEE Transactions On Applied Superconductivity, vol. 9, No. 2, Jun. 1999, pp. 1669-1672.*

(Continued)

Primary Examiner—David Nelms
Assistant Examiner—Long Tran
(74) Attorney, Agent, or Firm—Harness, Dickey & Pierce, P.L.C.

(57) ABSTRACT

A board for an electronic device is provide comprising a substrate having an amorphous layer, a buffer layer formed on the amorphous layer, the buffer layer having an orientation at least in the direction of its thickness, and a conductive oxide layer formed on the buffer layer by means of epitaxial growth, the conductive oxide layer having a metal oxide of a perovskite structure. The buffer layer contains at least one of the group consisting of a metal oxide of a NaCl structure and a metal oxide of a fluorite structure. Furthermore, the buffer layer 12 is formed by epitaxial growth in the cubic crystal (100) orientation.

16 Claims, 10 Drawing Sheets

| | FOREIGN PATENT DOCUMENTS | |
|---|---|---|
| JP | 6-145977 | 5/1994 |
| JP | 07-065642 | 3/1995 |
| JP | 07-286897 | 10/1995 |
| JP | 2614948 | 2/1997 |
| JP | 2670391 | 7/1997 |
| JP | 09-256152 | 9/1997 |
| JP | 10-121238 | 5/1998 |
| JP | 10-231122 | 9/1998 |
| JP | 11-049599 | 2/1999 |
| JP | 11-185544 | 7/1999 |
| JP | 2000-203836 | 7/2000 |
| JP | 2001-114594 | 4/2001 |
| JP | 2001-506411 | 5/2001 |
| JP | 2001-152324 | 6/2001 |

OTHER PUBLICATIONS

Chiba et al., The Effect of Lattice Matching between Buffer Layer and YBa2Cu3O7 Thin Film on In-Plane Alignment of C-axis Orientated Thin Films, IEEE Transactions On Applied Superconductivity, vol. 11, No. 1, Mar. 2001, pp. 2734-2737.*

Lock See Yu, James M.E. Harper, Jerome J. Cuomo and David A. Smith, "Alignment of thin films by glancing angle ion bombardment during deposition": 1985.

European Search Report from corresponding Application No. 03006728.4-2304.

* cited by examiner (a)

(b)

BOARD FOR ELECTRONIC DEVICE, ELECTRONIC DEVICE, FERROELECTRIC MEMORY, ELECTRONIC APPARATUS, INK-JET RECORDING HEAD, AND INK-JET PRINTER

BACKGROUND OF THE INVENTION

1. Technical Field of the Invention

The present invention relates to a board for an electronic device, an electronic device, a ferroelectric memory, an electronic apparatus, an ink-jet recording head, and an ink-jet printer.

2. Description of the Related Art

As well known to those skilled in the art, an electronic device, such as a piezoelectric element used in an ink-jet recording head, a capacitor used in a ferroelectric memory, etc., generally comprises a pair of electrodes (an upper electrode and a lower electrode) and a ferroelectric layer made of a ferroelectric material disposed between the electrodes.

As the ferroelectric material, a metal oxide having a perovskite structure, which is represented by the composition formula $ABO_3$, is used. In particular, lead zirconate titanate (PZT) having lead (Pb) as A, and a mixture of zirconium (Zr) and Titanium (Ti) as B, is widely used.

In the conventional electronic device, Pt has been used as the material for the lower electrode. Pt has strong self-orientation since it has a face centered cubic lattice (FCC) structure, which is a closest packing structure. Consequently, Pt still has strong orientation to (111) even when it is formed in the shape of a thin film on a layer made of an amorphous substance (hereinafter referred to as amorphous layer), such as $SiO_2$, with the result that the orientation of the ferroelectric layer formed thereon becomes better.

Since Pt has extremely strong orientation, however, its crystal grain has a columnar structure, and its grain boundary is arranged vertically. As a result, Pb in the ferroelectric layer is apt to diffuse to a bottom part (for example, a lower electrode) along the grain boundary. Furthermore, adhesive property between the lower electrode and the amorphous layer is very poor.

An intermediate layer made of Ti may be disposed between the lower electrode and the amorphous layer (for example, $SiO_2$ layer) to improve the adhesive property between the lower electrode and the amorphous layer, and a barrier layer made of TiN may be disposed between the lower electrode and the amorphous layer to prevent diffusion of Pb.

In the aforesaid cases, however, the electrode structure becomes complicated. Furthermore, Ti may be oxidized and Ti may be diffused to the lower electrode, with the result that the crystallinity of the ferroelectric material is lowered.

In case that the electronic device constructed as described above is applied to a piezoelectric element, an electrostriction characteristic is deteriorated. In case that the electronic device constructed as described above is applied to a capacitor, a hysteresis characteristic of polarized electric field (P-E), a leak current characteristic, a fatigue characteristic, etc. are deteriorated.

Therefore, the present invention has been made in view of the above problems, and it is an object of the present invention to provide a board for an electronic device, by which the electronic device with various excellent characteristics can be realized in the most suitable structure, an electronic device having such a board for the electronic device, a ferroelectric memory comprising such an electronic device, an electronic apparatus comprising the electronic device, an ink-jet recording head comprising the electronic device, and an ink-jet printer comprising the electronic device.

SUMMARY

The above and other objects can be accomplished by the present invention as described below.

(1) A board for an electronic device comprising: a substrate at least having a surface made of an amorphous substance; a buffer layer formed on the surface of the substrate, the buffer layer having an orientation at least in the direction of its thickness; and a conductive oxide layer formed on the buffer layer by means of epitaxial growth, the conductive oxide layer comprising a metal oxide of a perovskite structure.

(2) The board as set out in (1) above, wherein the buffer layer has an orientation in all the three-dimensional directions.

(3) The board as set out in (1) or (2) above, wherein the buffer layer is formed by epitaxial growth in the cubic crystal (100) orientation.

(4) The board as set out in any of (1) to (3) above, wherein the buffer layer contains at least one of the group consisting of a metal oxide of a NaCl structure and a metal oxide of a fluorite structure.

(5) The board as set out in (4) above, wherein the metal oxide of the NaCl structure is at least one of the group consisting of MgO, CaO, SrO, and BaO, or a solid solution containing MgO, CaO, SrO, or BaO.

(6) The board as set out in (4) above, wherein the metal oxide of the fluorite structure is at least one of the group consisting of yttria-stabilized zirconia, $CeO_2$, and $ZrO_2$, or a solid solution containing yttria-stabilized zirconia, $CeO_2$ or $ZrO_2$.

(7) The board as set out in any of (1) to (6) above, wherein the conductive oxide layer is formed by epitaxial growth in the pseudo cubic crystal (100) orientation or the pseudo cubic crystal (110) orientation.

(8) The board as set out in any of (1) to (7) above, wherein the metal oxide of the perovskite structure is at least one of the group consisting of $CaRuO_3$, $SrRuO_3$, and $BaRuO_3$, or a solid solution containing $CaRuO_3$, $SrRuO_3$, or $BaRuO_3$.

(9) An electronic device having the board as set out in any of (1) to (8) above.

(10) The device as set out in (9) above, wherein the device is a capacitor.

(11) The device as set out in (9) above, wherein the device is a piezoelectric actuator.

(12) A ferroelectric memory comprising the device as set out in (10) above.

(13) An electronic apparatus having the ferroelectric memory as set out in (12) above.

(14) An ink-jet recording head having the device as set out in (11) above.

(15) An ink-jet printer having the head as set out in (14) above.

DETAILED DESCRIPTION

The present inventor has made repeated studies of a material for a lower electrode (a conductive oxide layer) to substitute for Pt, and has come to the conclusion that a conductive oxide, such as $RuO_x$ or $IrO_2$, for example, especially, a metal oxide having a perovskite structure, such as strontium ruthenate ($SrRuO_3$), is very suitable for the material.

Such a metal oxide of the perovskite structure has the same crystal structure as a ferroelectric material, such as PZT. Consequently, the adhesive property between the lower electrode (conductive oxide layer) and the ferroelectric layer is improved, and the epitaxial growth of the ferroelectric layer is accomplished with ease. Furthermore, the metal oxide serves as an excellent barrier layer for preventing diffusion of Pb.

To improve various characteristics of the electronic device, it is preferable to provide a ferroelectric layer made of an oriented thin film, which requires the lower electrode (conductive oxide layer) to be formed by means of epitaxial growth.

In case that the lower electrode (conductive oxide layer) is to be directly formed on a Si substrate, which is widely used, a $SiO_2$ layer, which is an amorphous layer, is formed on the surface of the Si substrate. It is extremely difficult to form the lower electrode (conductive oxide layer) on the amorphous layer by means of epitaxial growth.

Therefore, the present inventor, after repeated studies, has come to the conclusion that if a buffer layer having an orientation at least in the direction of its thickness is disposed on the amorphous layer, the lower electrode (conductive oxide layer) can be easily formed on the buffer layer by means of epitaxial growth.

The present invention has been made based on the above discovery. A board for an electronic device according to the present invention is characterized in that the board comprises: a substrate at least having a surface made of an amorphous substance; a buffer layer formed on the surface of the substrate, the buffer layer having an orientation at least in the direction of its thickness; and a conductive oxide layer formed on the buffer layer by means of epitaxial growth, the conductive oxide layer having a metal oxide of a perovskite structure.

Detailed descriptions will now be given of a board for an electronic device, an electronic device, a ferroelectric memory, an electronic apparatus, an ink-jet recording head, and an ink-jet printer according to a preferred embodiment of the present invention, respectively.

Board for Electronic Device

First of all, the board for the electronic device will be described.

Figure 1:
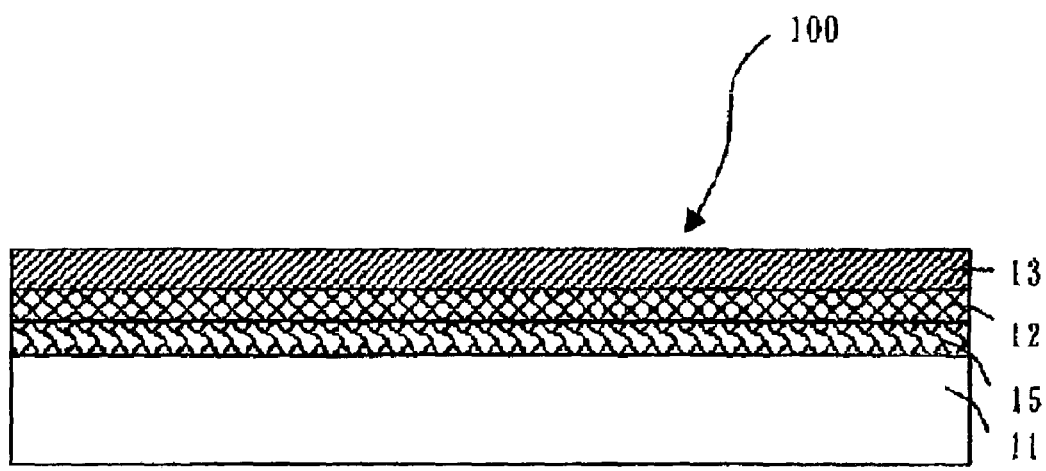
FIG. 1 is a cross sectional view illustrating a preferred embodiment of a board for an electronic device according to the present invention.
Figure 2:
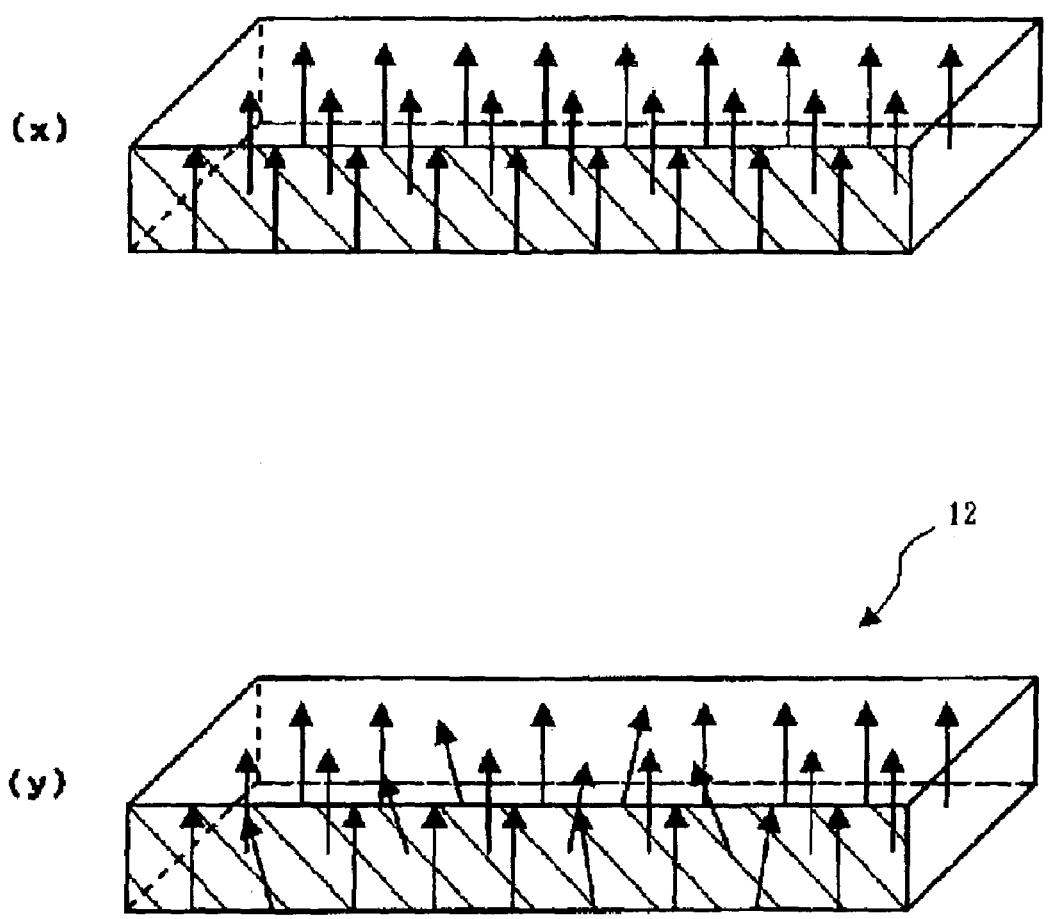
FIGS. 2(x) and (y) are views illustrating orientation of a buffer layer.
Figure 3:
FIGS. 3(a) and (b) are views for explaining how to manufacture the board for the electronic device according to the present invention.
Figure 3:
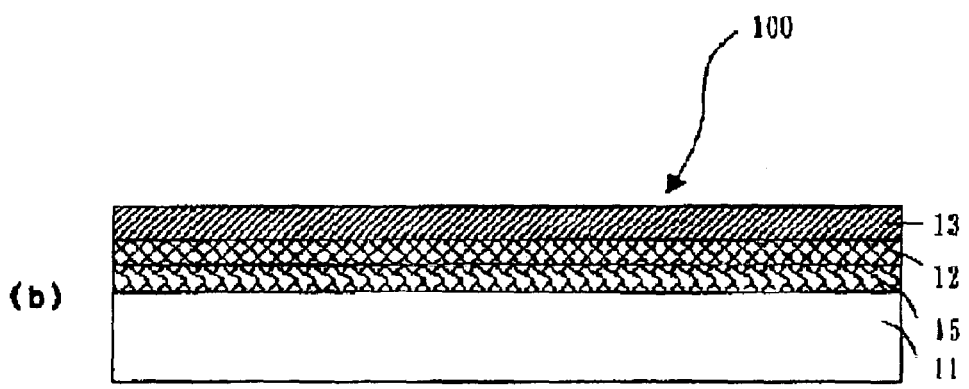

FIG. 1 is a cross sectional view illustrating a preferred embodiment of a board for an electronic device according to the present invention, FIGS. 2(x) and (y) are views illustrating orientations of a buffer layer, and FIG. 3 is a view for explaining how to manufacture the board for the electronic device according to the present invention.

As shown in FIG. 1, the board 100 for the electronic device comprises a substrate 11 having an amorphous layer 15, a buffer layer 12 formed on the amorphous layer 15, and a conductive oxide layer 13 formed on the buffer layer 12.

The substrate 11 serves to support the buffer layer 12 and the conductive oxide layer 13, which will be described later. The substrate 11 may be shaped as a plate-shaped member.

The substrate 11 has the amorphous layer 15 formed on its surface (on the top surface of the substrate 11 in FIG. 1). The amorphous layer 15 is formed of an amorphous substance. The amorphous layer 15 is formed integrally with the substrate 11, although the amorphous layer 15 may be fixedly attached to the substrate 11 if desired.

The substrate 11, may be, for example, a substrate of Si or a substrate of SOI (Si on Insulator). A substrate having its surface coated with a natural oxide film or a thermal oxide film, such as a $SiO_2$ film, may also be used. In this case, the natural oxide film or the thermal oxide film constitutes the amorphous layer 15.

The amorphous layer 15 may be formed of silicon nitride, silicon nitride oxide, various kinds of metal, etc., for example, in addition to $SiO_2$. In this case, the amorphous layer 15 is preferably formed, for example, by means of chemical vapor deposition (CVD), such as thermal CVD, plasma CVD, laser CVD, etc., physical vapor deposition (PVD), such as vacuum deposition, sputtering, ion plating, etc., sputter reflow, or thermal oxidation to the surface of the Si substrate.

In this embodiment, the substrate 11 has the amorphous layer 15 formed on the surface thereof. According to the present invention, however, the entire substrate 11 may be made of an amorphous substance. In this case, the substrate 11 may be formed of the following: polyolefin, such as polyethylene, polypropylene, ethylene-propylene copolymer, or ethylene-vinyl acetate copolymer (EVA); annular polyolefin; metamorphic polyolefin; polyvinyl chloride; polyvinylidene chloride; polystyrene; polyamide; polyimide; polyamidimide; polycarbonate; poly-(4-methylpentin-1); ionomer; acryl-based resin; polymethyl methacrylate; acrylonitrile-butadiene-styrene copolymer (ABS resin); acrylonitrile-styrene copolymer (AS resin); butadiene-styrene copolymer; polyoxymethylene; polyvinyl alcohol (PVA); ethylene-vinyl alcohol copolymer (EVOH); polyester, such as polyethylene terephthalate (PET), polybutylene terephthalate (PBT), or polycyclohexane terephthalate (PCT); polyether; polyether ketone (PEK); polyether ethyl ketone (PEEK); polyetherimide; polyacetal (POM); polyphenylene oxide; metamorphic polyphenylene oxide; polysulfone; polyethersulfone; polyphenylene sulfide; polyarylate; aromatic polyester (liquid crystal polymer); polytetrafluoroethylene; polyvinylidene fluoride; other fluoride-based resin; various thermoplastic elastomers, such as styrene-based, polyolefin-based, polyvinyl chloride-based, polyurethane-based, polyester-based, polyamide-based, polybutadiene-based, transpolyisoprene-based, fluoride rubber-based, or chlorinated polyethylene-based elastomer; epoxy resin; phenol resin; urea resin; melamine resin; unsaturated polyester; silicon resin; polyurethane; copolymer containing the above as its main component; blended body; various resin materials, such as polymer-alloy; or various glass materials.

The Si substrate, the SOI substrate, the various resin substrates, and the various glass substrates are commonly used in various fields and commercially available. Therefore, the cost for manufacturing the board 100 for the electronic device may be reduced by using the aforesaid substrates for the substrate 11.

The average thickness of the substrate 11 is preferably about 10 μm to 1 mm, and more preferably about 100 μm to 600 μm, although it is not particularly limited. Setting the average thickness of the substrate 11 within the aforesaid ranges provides the board 100 for the electronic device with increased strength and reduced size.

On the substrate 11 is formed the buffer layer 12 made of a thin film.

The buffer layer 12 is formed in such a manner that its orientation is at least in the direction of its thickness. The orientation of the conductive oxide layer 13, which will be described later, depends on that of the buffer layer 12, with the result that the conductive oxide layer 13 is grown on the buffer layer 12 in such a way that its orientation is also in the direction of its thickness. The present inventor has discovered the fact that normal epitaxial growth of the conductive oxide layer 13 is possible on the buffer layer 12.

The orientation in the thickness direction will now be described with reference to FIG. 2. One example of the orientation in the thickness direction is that the orientation is arranged in parallel with the thickness direction. Each of the arrows in FIG. 2 schematically indicates the orientation of one crystal particle.

The orientation in the thickness direction does not mean (1) that the orientation is irregular (i.e., the arrows are directed randomly) or (2) that the orientation is in the direction of the plane (i.e., most of the arrows are directed horizontally). Ideally, the orientation in the thickness direction means that the orientation is completely arranged in the thickness direction (i.e., all of the arrows are directed upwardly), as shown in FIG. 2(x). In fact, however, the orientation in the thickness direction includes a considerable number of other different orientations (i.e., the arrows angled relative to the thickness direction) as shown in FIG. 2(y), or that all of the orientations are apt to be arranged in the thickness direction.

The buffer layer 12 preferably has a single orientation (the orientation in the thickness direction), more preferably an orientation in the plane (the orientation in all the three-dimensional directions), whereby the aforesaid effect is improved.

By means of the buffer layer 12, there is excellent adhesive property (close bonding property) between the amorphous layer 15 and the conductive oxide layer 13.

The aforesaid buffer layer 12 contains at least one of the group consisting of a metal oxide of a NaCl structure, a metal oxide of a fluorite structure, and a metal oxide of a perovskite structure. Among others, the buffer layer 12 preferably contains at least one of the group consisting of a metal oxide of a NaCl structure, and a metal oxide of a fluorite structure. Furthermore, it is more preferable to provide the buffer layer 12 having the metal oxide of the NaCl structure or the metal oxide of the fluorite structure as its main component. The aforesaid two metal oxides each have minimal lattice mismatching with the metal oxide having the perovskite structure, whereby the adhesive property to the conductive oxide layer 13 is improved.

The metal oxide of the NaCl structure may be MgO, CaO, SrO, BaO, MnO, FeO, CoO, NiO, or a solid solution containing the above materials, for example. The metal oxide of the NaCl structure may be preferably at least one of the group consisting of MgO, CaO and SrO, BaO, or a solid solution containing the above materials. The metal oxide of the NaCl structure as mentioned above has even less lattice mismatching with the metal oxide having the perovskite structure.

The metal oxide of the fluorite structure may be yttria-stabilized zirconia, $CeO_2$, $ZrO_2$, $ThO_2$, $UO_2$, or a solid solution containing the above materials, for example. The metal oxide of the fluorite structure may be preferably at least one of the group consisting of yttria-stabilized zirconia, $CeO_2$, and $ZrO_2$, or a solid solution containing the above materials. The metal oxide of the fluorite structure as mentioned above has even less lattice mismatching with the metal oxide having the perovskite structure.

The buffer layer 12 includes at least one of the layers formed by epitaxial growth in the cubic crystal (100) orientation, the cubic crystal (110) orientation, or the cubic crystal (111) orientation, for example. Among others, the layer formed by epitaxial growth in the cubic crystal (100) orientation is preferable. The buffer layer 12 formed by epitaxial growth in the cubic crystal (100) orientation has a relatively small average thickness. Consequently, it is possible to prevent any degradation due to moisture laden in the air during manufacturing and in use even in case that the buffer layer 12 is formed of the metal oxide of the NaCl structure showing deliquescence, for example, such as MgO, CaO, SrO, BaO, whereby the board 100 for the electronic device becomes practical.

From this point of view, it is preferable to make the buffer layer 12 in the form of a thin film, if possible. Specifically, the average thickness of the buffer layer 12 is preferably not more than 10 nm, more preferably not more than 5 nm, by which the aforesaid effect is improved.

The buffer layer 12 having reduced average thickness in this way makes it possible to manufacture a thin capacitor (on the order of 10 nm in thickness, for example) required in compliance with the size reduction of a design rule of a ferroelectric memory, for example, in case of manufacturing the ferroelectric memory.

On the buffer layer 12 is formed the conductive oxide layer 13 by epitaxial growth. As described above, the buffer layer 12 has uniform orientation. Consequently, the conductive oxide layer 13 also has uniform orientation on the buffer layer 12 by means of epitaxial growth of the conductive oxide layer 13.

In case that various kinds of electronic devices are manufactured using the board 100 of the electronic device having the aforesaid conductive oxide layer 13, various characteristics of the electronic devices are improved, which will be described later.

The conductive oxide layer 13 also contains the metal oxide having the metal oxide of the perovskite structure. Preferably, the conductive oxide layer 13 has the metal oxide of the perovskite structure as its main component.

The metal oxide of the perovskite structure may be $CaRuO_3$, $SrRuO_3$, $BaRuO_3$, $SrVO_3$, $(La, Sr) MnO_3$, $(La, Sr) CrO_3$, $(La, Sr) CoO_3$, and a solid solution containing the above materials, for example. The metal oxide of the perovskite structure may be preferably at least one of the group consisting of $CaRuO_3$, $SrRuO_3$, and $BaRuO_3$, or a solid solution containing the above materials. The metal oxide of the perovskite structure as mentioned above has excellent conductivity and chemical stability. Consequently, the conductive oxide layer 13 also has excellent conductivity and chemical stability.

The aforesaid conductive oxide layer 13 is useful as an electrode in construction of the electronic device.

The conductive oxide layer 13 includes at least one of the layers formed by epitaxial growth in the pseudo cubic crystal (100) orientation, the pseudo cubic crystal (110) orientation, and the pseudo cubic crystal (111) orientation, for example. Among others, the layer formed by epitaxial growth in the pseudo cubic crystal (100) orientation is preferable. In case that various kinds of electronic devices are manufactured using the board 100 of the electronic device having the aforesaid conductive oxide layer 13, various characteristics of the electronic devices are improved.

The average thickness of the conductive oxide layer 13 is preferably about 10 nm to 300 nm, and more preferably about 50 nm to 150 nm, although it is not particularly limited.

By having the aforesaid average thickness, the conductive oxide layer 13 not only serves satisfactorily as the electrode, but the size of the electronic device is minimized as well.

Description of how to manufacture the board 100 of the electronic device will be made with reference to FIG. 3.

The aforesaid board 100 for the electronic device may be manufactured as follows.

The method of manufacturing the board 100 of the electronic device comprises the steps of forming the buffer layer 12 on the amorphous layer 15 (a buffer layer forming step), and forming the conductive oxide layer 13 on the buffer layer 12 (a conductive oxide forming step), each of which will be described hereinafter in turn.

The substrate 11 having the amorphous layer 15 is prepared. The substrate 11 preferably has a uniform thickness. Furthermore, the substrate 11 preferably has no curved or damaged parts.

[1A] Buffer Layer Forming Step

The buffer layer 12 is formed on the amorphous layer 15 of the substrate 11. For example, this step may be carried out as follows.

The substrate 11 is loaded in a substrate holder, and then disposed in a vacuum apparatus.

In the vacuum apparatus, a first target containing components of the aforesaid buffer layer 12 (a target for the buffer layer) is disposed apart from the substrate 11. The first target preferably has the same or similar composition as the targeted buffer layer 12.

Next, a laser beam is applied to the first target. Atoms comprising oxygen atoms and metal atoms are discharged from the first target, and a plume is generated. In other words, this plume is applied toward the amorphous layer 15. As a result, this plume comes in contact with the amorphous layer 15 (the substrate 11).

Almost at the same time, an ion beam is applied to the surface of the amorphous layer 15 at a prescribed angle to the amorphous layer 15.

As a result, the buffer layer 12 at least having the orientation in the thickness direction is formed on the amorphous layer 15 by means of epitaxial growth.

To discharge the aforesaid atoms from the first target, an argon gas (inert gas) plasma or an electron beam may be applied to the surface of the first target, instead of applying the laser beam to the surface of the first target.

Preferably, the laser beam is applied to the surface of the first target to discharge the atoms from the first target. According to the aforesaid method, it is possible to discharge the atoms from the first target easily and reliably using the vacuum apparatus of a simple structure having an incident window for the laser beam.

The laser beam may be a pulse beam having a wavelength ranging about 150 nm to 300 nm and a pulse length ranging about 1 ns to 100 ns. Specifically, an excimer laser, such as an ArF excimer laser, an KrF excimer laser, a kind of XeCl excimer laser, a YAG laser, a $YVO_4$ laser, $CO_2$ laser, etc., may be used as the source of the laser beam. Preferably, the ArF excimer laser or the KrF excimer laser is used as the laser beam. The ArF excimer laser and the KrF excimer laser are convenient to handle, and can discharge the atoms from the first target more efficiently.

The ion beam applied to the surface of the amorphous layer 15 may be an ion of at least one of the group consisting of argon, helium, neon, xenon and krypton, which are all inert gases, or a mixed ion of the aforesaid ions and an oxygen ion, although it is not particularly limited.

An ion source of the ion beam may be a Kauffman ion source. By using such an ion source, the ion beam can be generated relatively easily.

The angle of applying the ion beam to the surface of the amorphous layer 15 in the normal direction (the aforesaid prescribed angle) is 35° to 65°, although it is not particularly limited. In case of forming the buffer layer 12 with the metal oxide of the NaCl structure as the main component, the applying angle is preferably 42° to 47°. In case of forming the buffer layer 12 with the metal oxide of the fluorite structure as the main component, the applying angle is preferably 52° to 57°. If the ion beam is applied to the surface of the amorphous layer 15 using the applying angle set to the aforesaid values, the buffer layer 12 having the orientation in the plane as well as the cubic crystal (100) orientation can be formed.

Each of the conditions desired to form the buffer layer 12 is established in such a way that the buffer layer 12 is epitaxially grown. For example, the conditions may be established as follows.

Frequency of the laser beam is not more than 30 Hz, preferably not more than 15 Hz.

Energy density of the laser beam is not less than 0.5 $J/cm^2$, preferably not less than 2 $J/cm^2$.

Accelerated voltage of the ion beam is about 100 to 300 V, preferably about 150 V to 250 V.

Amount of irradiation of the ion beam is about 1 to 30 mA, preferably about 5 to 15 mA.

Temperature of the substrate 11 is about 0 and 50° C., preferably about 5 to 30° C. (room temperature).

The distance between the substrate 11 and the first target is not more than 60 mm, preferably not more than 45 mm.

Pressure in the vacuum apparatus is not more than $133 \times 10^{-1}$ Pa ($1 \times 10^{-1}$ Torr), preferably not more than $133 \times 10^{-3}$ Pa ($1 \times 10^{-3}$ Torr).

Atmosphere in the vacuum apparatus is provided in such a way that the mixing ratio of the inert gas to the oxygen in volume is about 300:1 to 10:1, preferably about 150:1 to 50:1.

By establishing each of the conditions for forming the buffer layer 12 within the above ranges, respectively, the buffer layer 12 can be formed by means of the epitaxial growth more efficiently.

By properly setting the time for irradiating the laser beam and the ion beam, the average thickness of the buffer layer 12 can be adjusted within the aforesaid range. The time for irradiating the laser beam and the ion beam is normally not more than 200 seconds, preferably not more than 100 seconds, although it is different depending on each of the conditions.

According to the aforesaid method for forming the buffer layer 12, which can adjust the applying angle of the ion beam, it is possible to adjust the uniform orientation in such a way that the orientation has other different orientations. Furthermore, the orientation of the buffer layer 12 may be arranged more uniformly. Consequently, the average thickness of the buffer layer 12 may be further reduced.

By the step as described above, the buffer layer 12 is provided (Refer to FIG. 3a).

[2A] Conductive Oxide Layer Forming Step

The conductive oxide layer 13 is formed on the buffer layer 12. For example, this step may be carried out as follows.

Prior to forming the conductive oxide layer 13, a second target containing components of the aforesaid conductive oxide layer 13 (a target for the conductive oxide layer) is disposed apart from the buffer layer 12 (the substrate 11), in place of the first target. The second target preferably has the same or similar composition as the targeted conductive oxide layer 13.

Following the step [1A], the plume of atoms containing oxygen atom and various metal atoms is applied to the buffer layer 12. As a result, the plume comes into contact with the surface (the top surface) of the buffer layer 12, and thus the conductive oxide layer 13 containing the metal oxide of the perovskite structure as mentioned above is formed in the shape of a thin film by means of epitaxial growth.

Preferably, the atoms containing the oxygen atom and various metal atoms are discharged from the second target, and then the plume is generated by applying the laser beam to the surface of the second target in the same manner as the step [1A].

The laser beam may be preferably an ArF excimer laser or a KrF excimer laser in the same manner as the step [1A].

If necessary, the conductive oxide layer 13 may be formed on the buffer layer 12 by applying the ion beam to the surface of the buffer layer 12 in the same manner as the step [1A], whereby the conductive oxide layer 13 can be formed more efficiently.

Each of the conditions desired to form the conductive oxide layer 13 is established in such a way that various metal atoms arrive at the top surface of the buffer layer 12 in the prescribed ratio, and the conductive oxide layer 13 is epitaxially grown. For example, the conditions may be established as follows.

Frequency of the laser beam is not more than 30 Hz, preferably not more than 15 Hz.

Energy density of the laser beam is not less than 0.5 J/cm$^2$, preferably not less than 2 J/cm$^2$.

Temperature of the substrate 11 having the buffer layer 12 formed thereon is about 300 to 800° C., preferably about 400 to 700° C.

In case of applying the ion beam in combination with the laser beam, the temperature of the substrate 11 is about 0 to 50° C., preferably about 5 to 30° C. (room temperature).

The distance between the substrate 11 having the buffer layer 12 formed thereon and the second target is not more than 60 mm, preferably not more than 45 mm.

Pressure in the vacuum apparatus is not more than 1 atmospheric pressure. Preferably, the partial pressure of the oxygen is not less than $133 \times 10^{-3}$ Pa ($1 \times 10^{-3}$ Torr) during supply of the oxygen gas, and not less than $133 \times 10^{-5}$ Pa ($1 \times 10^{-5}$ Torr) during radical supply of the atomic oxygen.

In case of applying the ion beam in combination with the laser beam, the pressure in the vacuum apparatus is not more than $133 \times 10^{-1}$ Pa ($1 \times 10^{-1}$ Torr), preferably not more than $133 \times 10^{-3}$ Pa ($1 \times 10^{-3}$ Torr). In this case, atmosphere in the vacuum apparatus is provided in such a way that the mixing ratio of the inert gas to the oxygen in volume is about 300:1 to 10:1, preferably about 150:1 to 50:1.

By establishing the conditions for forming the conductive oxide layer 13 within the above ranges, respectively, the conductive oxide layer 13 can be formed more efficiently.

By properly setting the time for applying the laser beam, the average thickness of the conductive oxide layer 13 can be adjusted within the aforesaid range. The time for applying the laser beam is normally about 3 to 90 minutes, preferably about 15 to 45 minutes, although it is different depending on each of the conditions.

By the step as described above, the conductive oxide layer 13 is provided (Refer to FIG. 3b).

Through the aforesaid steps [1A] and [2A], the board 100 for the electronic device is manufactured.

Prior to the step [1A], a step for cleaning the substrate 11, i.e., for removing foreign matter on the surface of the substrate 11 (for example, removing the excess known as fat) may be provided as a pre-treatment step.

The removal of the foreign matter is carried out by bringing the substrate 11 into contact with a removing liquid.

To bring the substrate 11 into contact with the removing liquid, a method for depositing the substrate 11 in the removing liquid (a depositing method), a method for spraying (showering) the removing liquid on the surface of the substrate 11, or a method for coating the removing liquid on the surface of the substrate 11 may be used.

Among others, the depositing method is useful to bring the substrate 11 into contact with the removing liquid. By using the deposing method, the foreign matter (for example, organic matter) can be removed from the surface of the substrate 11 easily and reliably. Furthermore, a plurality of (a large amount of) substrates 11 can be processed simultaneously by using the depositing method.

In this case, it is preferable to apply ultrasonic vibration to the removing liquid or to shake at least one of the substrate 11 and the removing liquid.

The removing liquid may be an organic solvent made of the following: alcohols, such as methyl alcohol, ethyl alcohol, propyl alcohol, butyl alcohol; ketones, such as acetone, methyl ethyl ketone, methyl isobutyl ketone; esters, such as ethyl acetate, methyl acetate; ethers, such as diethylmethyl, diisopropyl ether, tetrahydrofuran, dioxane; nitrites, such as acetonitrile, propyonitrile; halogenated hydrocarbons, such as methylene chloride, fluoroform, 1,2-dichloroethane, 1,1,2,2-tetrachloroethane; hydrocarbons, such as n-hexane, petroleum ether, toluene, benzene, xylene; or a mixture of one or more of the group consisting of the above materials.

Electronic Device (Capacitor)

Application of the electronic device according to the present invention to a capacitor will now be described.

Figure 4:
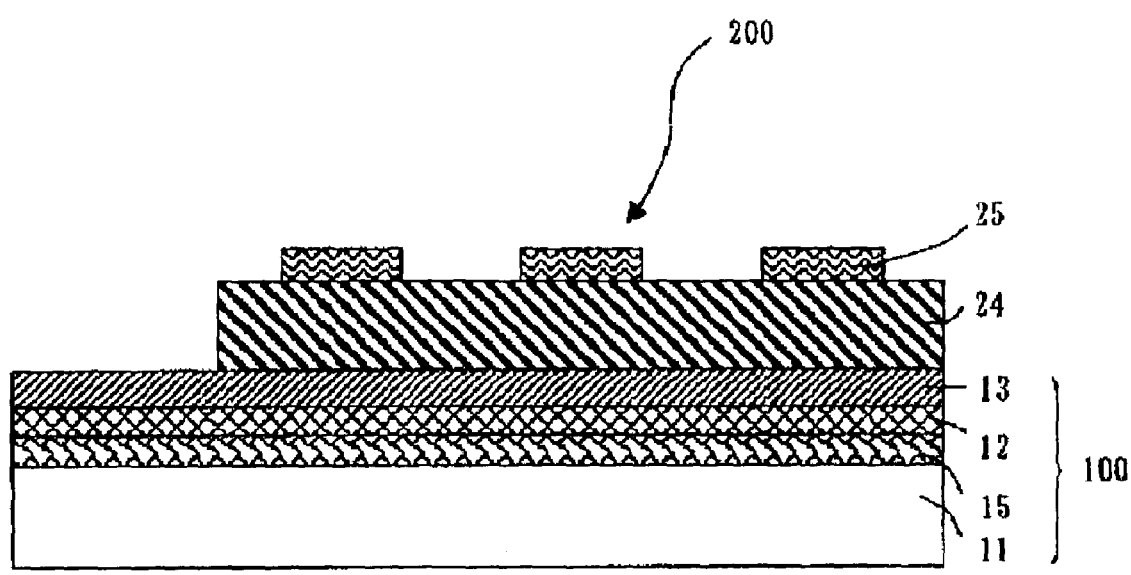
FIG. 4 is a cross sectional view illustrating the electronic device according to the present invention applied to a capacitor.

FIG. 4 is a cross sectional view illustrating the electronic device according to the present invention applied to a capacitor.

As to a capacitor 200 as shown in FIG. 4, the difference between the capacitor 200 and the board 100 for the electronic device will be described, and thus the description of the same elements of the capacitor 200 as the board 100 for the electronic device will be omitted.

The capacitor 200 comprises the board 100 for the electronic device, a ferroelectric layer 24 disposed at a prescribed area on the board 100 for the electronic device, and an upper electrode layer 25 disposed on the ferroelectric layer 24.

The conductive oxide layer 13 of the board 100 for the electronic device serves as one of the electrode layers in the capacitor 200. The conductive oxide layer 13 is hereinafter referred to the lower electrode layer 13.

The ferroelectric layer 24 is formed on the lower electrode layer 13 by epitaxial growth. As described above, the lower electrode layer 13 has uniform orientation. Consequently, the ferroelectric layer 24 also has uniform orientation on the lower electrode layer 13 by means of epitaxial growth of the ferroelectric layer 24.

The capacitor 200 has increased residual polarization and reduced coercive electric field. That is to say, various characteristics of the capacitor 200 are improved. In case that the ferroelectric memory is manufactured using the capacitor 200, therefore, the ferroelectric memory having excellent angulation of the hysteresis loop can be provided.

The ferroelectric layer 24 may be formed of various ferroelectric materials. Preferably, the ferroelectric layer 24 contains the ferroelectric material of the perovskite structure. More preferably, the ferroelectric layer 24 is made with the ferroelectric material of the perovskite structure as the main component. Furthermore, a ferroelectric material having its epitaxial growth in the tetragonal crystal (001) orientation or a ferroelectric material having its epitaxial growth in the rhombohedron crystal (100) orientation may be used as the ferroelectric material of the perovskite structure. Preferably, the ferroelectric material having its epitaxial growth in the tetragonal crystal (001) orientation is normally used, whereby its effect is improved.

The ferroelectric material of the perovskite structure may be a metal oxide of the perovskite structure, such as Pb (Zr, Ti) $O_3$ (PZT), (Pb, La) (Zr, Ti) $O_3$ (PLZT), $BaTiO_3$, $KNbO_3$, $PbZnO_3$, $PbNbO_3$, $PbFeO_3$, $PbWO_3$, a compound of the bedded structure, such as $SrBi_2$ (Ta, $Nb)_2O_9$, (Bi, La)$_4$Ti$_3$O$_{12}$, or a solid solution containing the above materials, for example. The ferroelectric material of the perovskite structure may be preferably at least one of the group consisting of PZT and $BaTiO_3$, or a solid solution containing the above materials. Consequently, various characteristics of the capacitor 200 are further improved.

As described above, the lower electrode layer 13 contains the metal oxide of the perovskite structure (especially, having the metal oxide of the perovskite structure as the main component). The metal oxide of the perovskite structure has minimal lattice mismatching with the ferroelectric material of the perovskite structure. Consequently, the ferroelectric layer 24 can be formed on the lower electrode layer 13 easily and reliably by means of epitaxial growth in the tetragonal crystal (001) orientation, whereby the adhesive property of the resulting ferroelectric layer 24 to the lower electrode layer 13 is improved.

The average thickness of the ferroelectric layer 24 is preferably about 50 nm to 300 nm, and more preferably about 100 nm to 200 nm, although it is not particularly limited. Setting the average thickness of the ferroelectric layer 24 within the aforesaid ranges provides the capacitor 200 with reduced size and various excellent characteristics.

The upper electrode layer 25 of the incised (or zonal) shape is formed on the ferroelectric layer 24.

The material for the upper electrode layer 25 may be one or more of the group consisting of Pt, Ir, Au, Ag and Ru, or an alloy containing the above materials.

The average thickness of the upper electrode layer 25 is preferably about 10 nm to 300 nm, and more preferably about 50 nm to 150 nm, although it is not particularly limited.

Next, the method for manufacturing the capacitor 200 will be described.

For example, the aforesaid capacitor 200 may be manufactured as follows.

The method for manufacturing the capacitor 200 comprises the steps of forming the buffer layer 12 on the amorphous layer 15 (a buffer layer forming step), forming the lower electrode layer (the conductive oxide layer) 13 on the buffer layer 12 (a lower electrode layer forming step), forming the ferroelectric layer 24 on the lower electrode layer 13 (a ferroelectric layer forming step), drawing (etching and exposing) the lower electrode layer 13 (a lower electrode drawing step), and forming the upper electrode layer 25 on the ferroelectric layer 24 (an upper electrode forming step), each of which will be described hereinafter in turn.

[1B] Buffer Layer Forming Step

This step is carried out in the same way as the aforesaid step [1A].

[2B] Lower Electrode Layer Forming Step

This step is carried out in the same way as the aforesaid step [2A].

[3B] Ferroelectric Layer Forming Step

The ferroelectric layer 24 is formed on the lower electrode layer 13. For example, this step may be carried out as follows.

Prior to the forming the ferroelectric layer 24, a third target containing components of the aforesaid ferroelectric layer 24 (a target for the ferroelectric layer) is disposed apart from the board 100 for the electronic device, in place of the second target. The third target preferably has the same or similar composition as the targeted ferroelectric layer 24.

Following the step [2B], a plume of atoms containing oxygen atoms and various metal atoms is applied to the lower electrode layer 13. As a result, the plume comes into contact with the surface (the top surface) of the lower electrode layer 13, and thus the ferroelectric layer 24 containing the ferroelectric material of the perovskite structure as mentioned above is formed in the shape of a thin film by means of epitaxial growth in the tetragonal crystal (001) orientation.

Preferably, the atoms containing the oxygen atom and various metal atoms are discharged from the third target, and then the plume is generated by applying the laser beam to the surface of the third target in the same manner as the step [1A].

Preferably, the ArF excimer laser or the KrF excimer laser is used as the laser beam in the same manner as the step [1A].

If necessary, the ferroelectric layer 24 may be formed on the lower electrode layer 13 by applying the ion beam to the surface of the lower electrode layer 13 in the same manner as the step [1A], whereby the ferroelectric layer 24 can be formed more efficiently.

Conditions desired to form the ferroelectric layer 24 are established in such a way that various metal atoms contact to the top surface of the lower electrode layer 13 in the prescribed ratio (i.e., the composition ratio of the ferroelectric material of the perovskite structure), and the ferroelectric layer 24 is formed by epitaxial growth. For example, the conditions may be established as follows.

Frequency of the laser beam is not more than 30 Hz, preferably not more than 15 Hz.

Energy density of the laser beam is not less than 0.5 $J/cm^2$, preferably not less than 2 $J/cm^2$.

Temperature of the substrate 11 having the lower electrode layer 13 formed thereon is about 300 to 800° C., preferably about 400 to 700° C.

In case of applying the ion beam in combination with the laser beam, the temperature of the substrate 11 is about 0 to 50° C., preferably about 5 to 30° C. (room temperature).

The distance between the substrate 11 having the lower electrode layer 13 formed thereon and the third target is not more than 60 mm, preferably not more than 45 mm.

Pressure in the vacuum apparatus is not more than 1 atmosphere. Preferably, the partial pressure of the oxygen is not less than $133 \times 10^{-3}$ Pa ($1 \times 10^{-3}$ Torr) during supply of the oxygen gas, and not less than $133 \times 10^{-5}$ Pa ($1 \times 10^{-5}$ Torr) during supply of the atomic oxygen radicals.

In case of applying the ion beam in combination with the laser beam, the pressure in the vacuum apparatus is not more than $133 \times 10^{-1}$ Pa ($1 \times 10^{-1}$ Torr), preferably not more than $133 \times 10^{-3}$ Pa ($1 \times 10^{-3}$ Torr). In this case, atmosphere in the vacuum apparatus is provided in such a way that the mixing ratio of the inert gas to the oxygen in volume is about 300:1 to 10:1, preferably about 150:1 to 50:1.

By establishing the conditions for forming the ferroelectric layer 24 within the above ranges, respectively, the ferroelectric layer 24 can be formed more efficiently.

By properly setting the time for applying the laser beam, the average thickness of the ferroelectric layer 24 can be adjusted within the aforesaid range. The time for applying the laser beam is normally about 3 to 90 minutes, preferably about 15 to 45 minutes, although it is different depending on each of the conditions.

By the step as described above, the ferroelectric layer 24 is provided.

[4B] Lower Electrode Drawing Step

The lower electrode layer 13 is drawn by removing a portion of the ferroelectric layer 24. As a result, the ferroelectric layer 24 is disposed at a prescribed area on the lower electrode layer 13, which may be carried out, for example, by means of photolithography.

First, a resist layer is formed on the ferroelectric layer 24 while leaving the removed portion.

Next, an etching treatment (for example, a wet etching treatment, a dry etching treatment, etc.) is carried out to the ferroelectric layer 24.

Finally, the resist layer is removed, whereby a portion of the lower electrode layer 13 (the left side in FIG. 4) is exposed.

[5B] Upper Electrode Layer Forming Step

The upper electrode layer 25 is formed on the ferroelectric layer 24. For example, this step may be carried out as follows.

First, a mask layer having a desired pattern is formed on the ferroelectric layer 24, for example, by means of sputtering.

Next, the material of the upper electrode layer 25 consisting of Pt, for example, is formed in the shape of a thin film by means of depositing, sputtering, or printing.

Finally, the mask layer is removed.

By the step as described above, the upper electrode layer 25 is provided.

Through the aforesaid steps [1B] to [5B], the capacitor 200 is manufactured.

Electronic Device (Cantilever)

Application of the electronic device according to the present invention to a cantilever (a piezoelectric actuator) will now be described.

Figure 5:
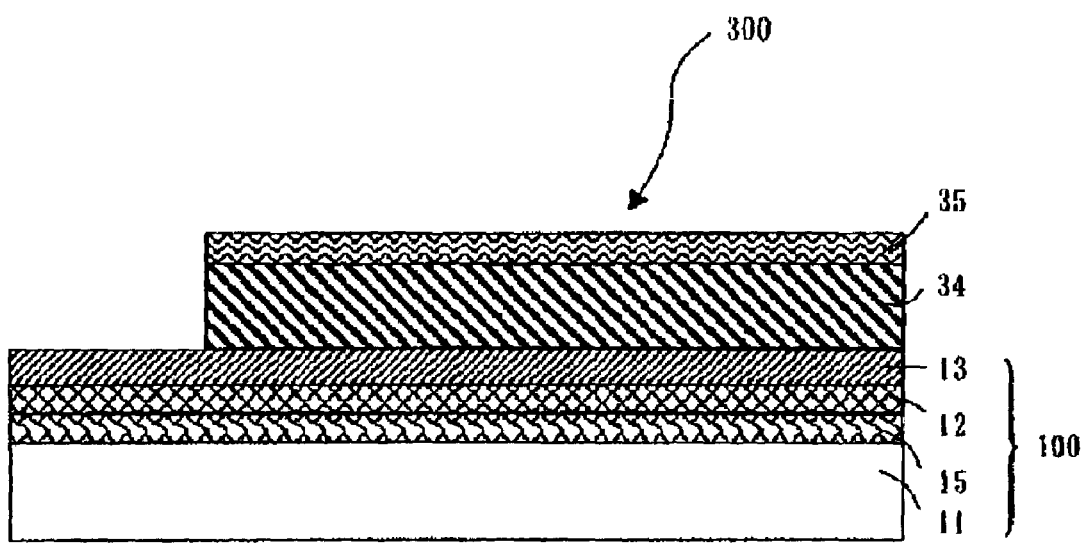
FIG. 5 is a cross sectional view illustrating the electronic device according to the present invention applied to a cantilever.

FIG. 5 is a cross sectional view illustrating the electronic device according to the present invention applied to a cantilever.

As to a cantilever 300 as shown in FIG. 5, the difference of the cantilever 300 from the board 100 for the electronic device and the capacitor 200 will be described, and thus the description of the same elements of the cantilever 300 as the board 100 for the electronic device and the capacitor 200 will be omitted.

The cantilever 300 comprises the board 100 for the electronic device, a piezoelectric body layer 34 disposed at a prescribed area on the board 100 for the electronic device, and an upper electrode layer 35 disposed on the piezoelectric body layer 34.

The substrate 11 serves as an elastic substrate of a monomorph type cantilever in the cantilever 300.

Furthermore, the conductive oxide layer 13 of the board 100 for the electronic device serves as one of the electrode layers in the cantilever 300. The conductive oxide layer 13 is hereinafter referred to the lower electrode layer 13.

The piezoelectric body layer 34 is formed on the lower electrode layer 13 by epitaxial growth. As described above, the lower electrode layer 13 has uniform orientation. Consequently, the piezoelectric body layer 34 also has uniform orientation on the lower electrode layer 13 by means of epitaxial growth of piezoelectric body layer 34.

Consequently, the cantilever 300 has improved electrostriction and other various characteristics.

The piezoelectric body layer 34 may be formed of various ferroelectric materials. Preferably, the piezoelectric body layer 34 contains the ferroelectric material of the perovskite structure. More preferably, the piezoelectric body layer 34 is made with the ferroelectric material of the perovskite structure as the main component. Furthermore, a ferroelectric material having its epitaxial growth in the rhombohedron crystal (100) orientation or a ferroelectric material having its epitaxial growth in the tetragonal crystal (001) orientation may be used as the ferroelectric material of the perovskite structure. Preferably, the ferroelectric material having its epitaxial growth in the rhombohedron crystal (100) orientation is normally used, whereby its effect is improved.

The ferroelectric material of the perovskite structure may be the same material as that of the aforesaid capacitor 200. Consequently, various characteristics of the cantilever 300 are further improved.

As described above, the lower electrode layer 13 contains the metal oxide of the perovskite structure (especially, having the metal oxide of the perovskite structure as the main component). The metal oxide of the perovskite structure has little lattice mismatching with the ferroelectric material of the perovskite structure. Consequently, the piezoelectric body layer 34 can be formed on the lower electrode layer 13 easily and reliably by means of epitaxial growth in the rhombohedron crystal (100) orientation, whereby the adhesive property of the piezoelectric body layer 34 to the lower electrode layer 13 is improved.

The average thickness of the piezoelectric body layer 34 is preferably about 100 nm to 3000 nm, and more preferably about 500 nm to 2000 nm, although it is not particularly limited. Setting the average thickness of the piezoelectric body layer 34 within the aforesaid ranges provides the cantilever 300 with reduced size and various excellent characteristics.

The upper electrode layer 35 is formed on the piezoelectric body layer 34.

The material and the average thickness of the upper electrode layer 35 are the same as those of the upper electrode layer 25 of the capacitor 200.

Next, the method for manufacturing the cantilever 300 will be described.

For example, the aforesaid cantilever 300 may be manufactured as follows.

The method for manufacturing the cantilever 300 comprises the steps of forming the buffer layer 12 on the amorphous layer 15 (a buffer layer forming step), forming the lower electrode layer (the conductive oxide layer) 13 on the buffer layer 12 (a lower electrode layer forming step), forming the piezoelectric body layer 34 on the lower electrode layer 13 (a piezoelectric body layer forming step), drawing the lower electrode layer 13 (a lower electrode drawing step), and forming the upper electrode layer 35 on the piezoelectric body layer 34 (an upper electrode forming step), each of which will be described hereinafter in turn.

[1C] Buffer Layer Forming Step

This step is carried out in the same way as the aforesaid step [1A].

[2C] Lower Electrode Layer Forming Step

This step is carried out in the same way as the aforesaid step [2A].

[3C] Piezoelectric Body Layer Forming Step

The piezoelectric body layer 34 is formed on the lower electrode layer 13. This step may be carried out in the same way as the aforesaid step [3B].

Prior to the forming the piezoelectric body layer 34, a third' target containing components of the aforesaid piezoelectric body layer 34 (a target for the piezoelectric body layer) is disposed apart from the board 100 for the electronic device, in place of the second target.

The third' target preferably has the same or similar composition as the targeted piezoelectric body layer 34.

[4C] Lower Electrode Drawing Step

This step is carried out in the same way as the aforesaid step [4B].

[5C] Upper Electrode Layer Forming Step

This step is carried out in the same way as the aforesaid step [5B].

Through the aforesaid steps [1C] to [5C], the cantilever 300 is manufactured.

Ferroelectric Memory

A ferroelectric memory comprising the electronic device as the capacitor will now be described.

Figure 6:
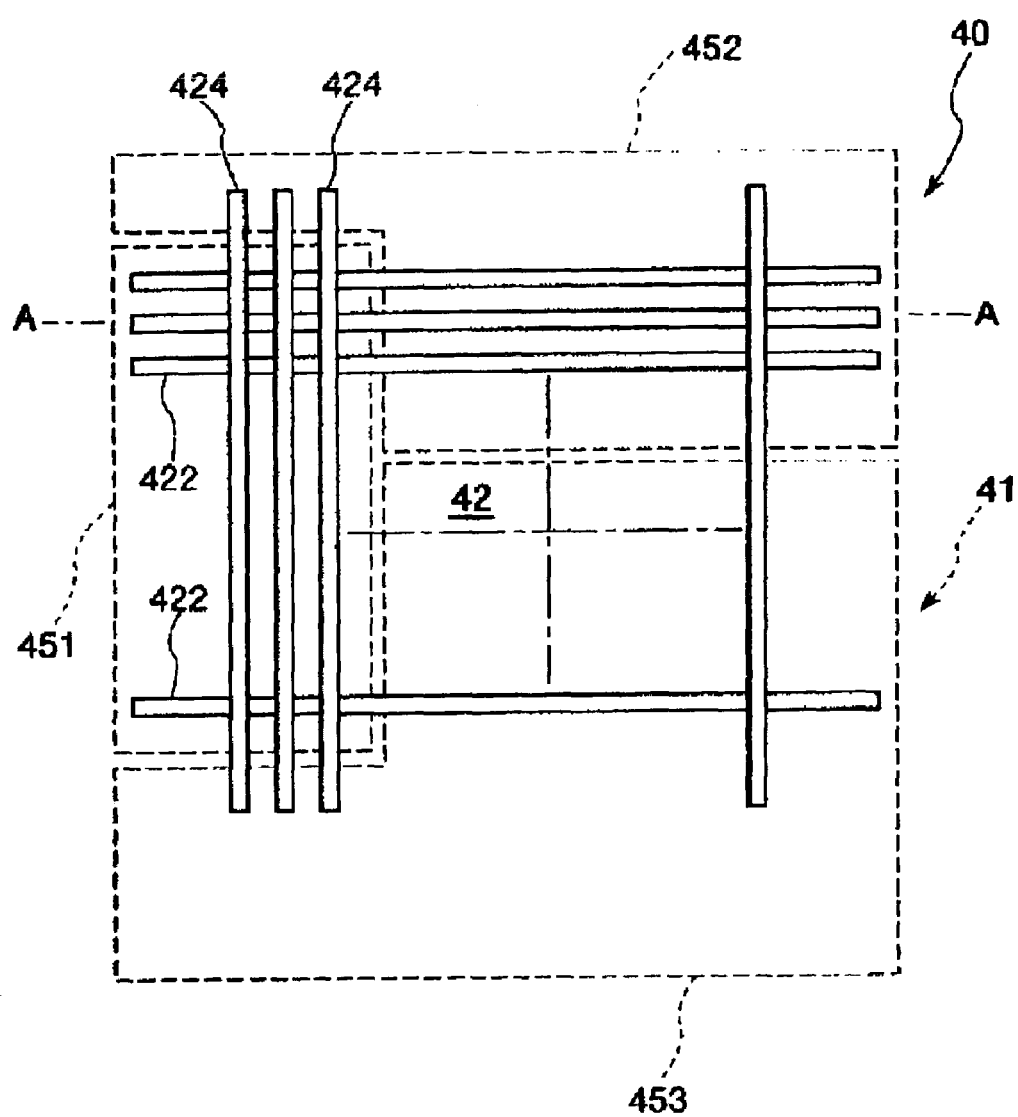
FIG. 6 is a plan view schematically illustrating a preferred embodiment of a ferroelectric memory according to the present invention.
Figure 7:
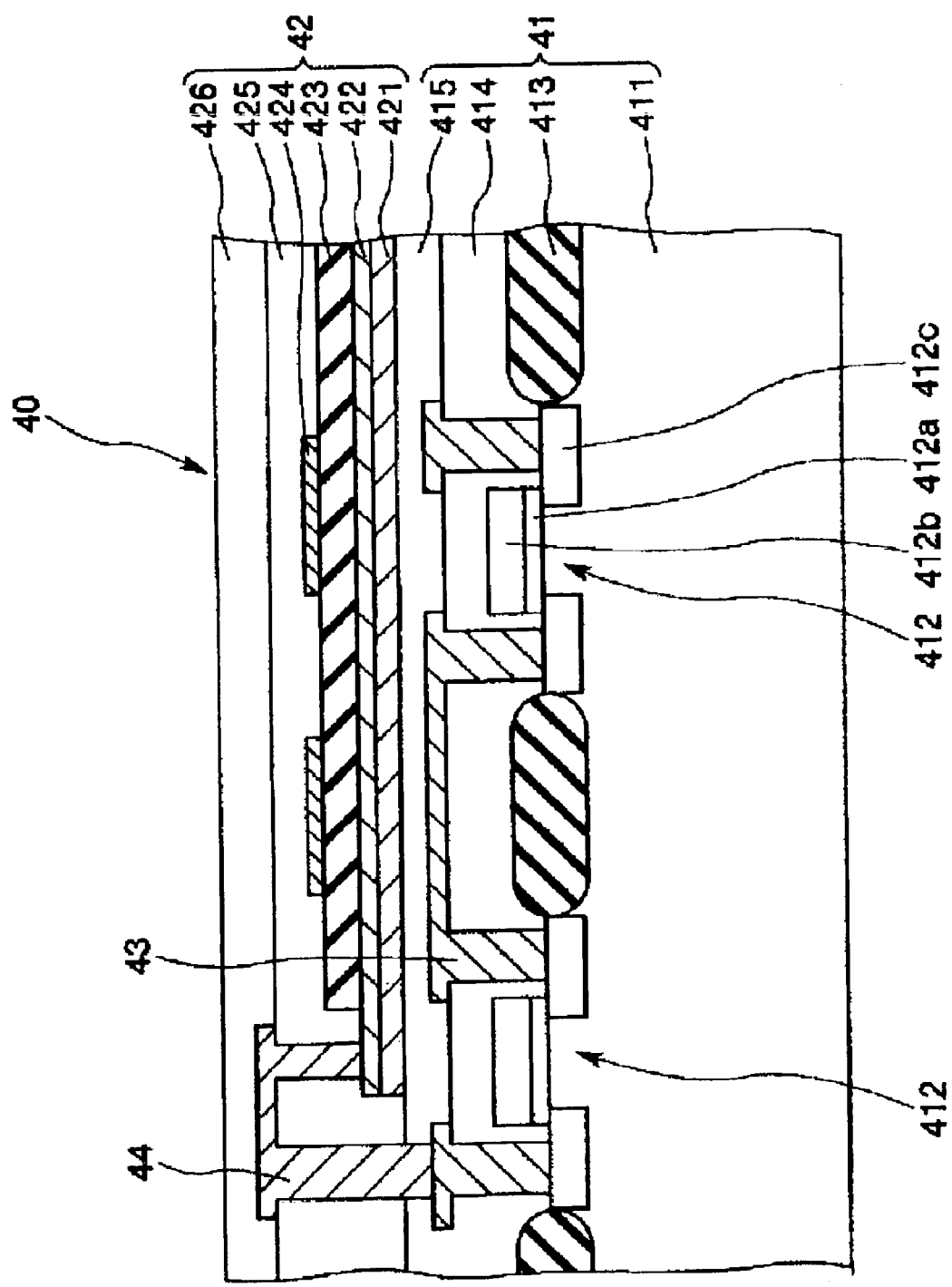
FIG. 7 is a cross sectional view taken along line A—A of FIG. 6.

FIG. 6 is a plan view schematically illustrating a preferred embodiment of a ferroelectric memory according to the present invention, and FIG. 7 is a cross sectional view taken along line A—A of FIG. 6. It should be noted that some of the oblique lines (hatching) indicating cross sections of the components are omitted for the purpose of clarity of the drawing in FIG. 7.

As shown in FIG. 7, a ferroelectric memory 40 comprises a memory cell array 42 and a peripheral circuit group 41. The memory cell array 42 and the peripheral circuit group 41 are formed on different layers, respectively. In this embodiment, the peripheral circuit group 41 is formed on the lower layer (the lower part), while the memory cell array 42 is formed on the upper layer (the upper part).

The memory cell array 42 is arranged in such a way that a first signal electrode (word line) 422 for selecting rows and a second signal electrode (bit line) 424 for selecting columns are perpendicular to each other. However, the signal electrodes may be arranged opposite to the aforesaid arrangement of the electrodes. In other words, the first signal electrode 422 may be the bit line, while the second signal electrode 424 may be the word line.

Between the first signal electrode 422 and the second signal electrode 424 is disposed a ferroelectric layer 423. At the intersection of the first signal electrode 422 and the second signal electrode 424 are provided unit capacitors (memory cells), respectively.

To cover the first signal electrode 422, the ferroelectric layer 423, and the second signal electrode 424, a first protecting layer 425 made of an insulating material is provided.

To cover a second wiring layer 44, a second protecting layer 426 made of an insulating material is formed on the first protecting layer 425.

The first signal electrode 422 and the second signal electrode 424 are electrically connected to a first wiring layer 43 of the peripheral circuit group 41 via the second wiring layer 44, respectively.

As shown in FIG. 6, the peripheral circuit group 41 comprises a first driving circuit 451 for selectively controlling the first signal electrode 422, a second driving circuit 452 for selectively controlling the second signal electrode 424, and a signal detecting circuit 453, such as a sense amplifier, whereby it is possible to selectively write information to the unit capacitor (memory cell) or selectively read information from the unit capacitor (memory cell).

As shown in FIG. 7, the peripheral circuit group 41 includes MOS transistors 412 formed on a semiconductor substrate 411. Each of the MOS transistors 412 comprises a gate insulating layer 412a, a gate electrode 412b, and a source/drain region 412c.

The MOS transistors 412 are separated from each other by means of an element separation region 413, and electrically connected to each other by means of the first wiring layer 43.

A first interlayer insulating layer 414 is formed on the semiconductor substrate 411 having the MOS transistor 412 formed thereon, while a second interlayer insulating layer 415 is formed on the first interlayer insulating layer 414 to cover the first wiring layer 43.

On the second interlayer insulating layer 415 is formed a memory cell array 42 including a bottom layer (buffer layer) 421.

The peripheral circuit group 41 and the memory cell array 42 are electrically connected to each other by means of the second wiring layer 44.

In this embodiment, the second interlayer insulating layer 415, the bottom layer 421, the first signal electrode 422, the ferroelectric layer 423, and the second signal electrode 424 together constitute the aforesaid capacitor 200.

In this embodiment, therefore, at least the surface of the second interlayer insulating layer 415 is made of an amorphous material.

With the ferroelectric memory 40 constructed as described above, the peripheral circuit group 41 and the memory cell array 42 are stacked one after another on the single semiconductor substrate 411. Consequently, a chip area is remarkably reduced, and integration of the unit capacitor (memory cell) is increased as compared with the case that the peripheral circuit group 41 and the memory cell array 42 are disposed on the same plane.

Now, one example of a writing and reading operation to/from the ferroelectric memory 40 will be described in detail.

As to the reading operation, reading voltage [$V_0$] is applied to the selected unit capacitor. At this time, an operation for writing '0' is carried out simultaneously. Current flowing on the selected bit line or electric potential in the bit line of high impedance is read by means of the sense amplifier.

At this time, prescribed voltage is applied to the unselected unit capacitor to prevent any cross talk at the time of the reading operation.

As to the writing operation, voltage [$-V_0$] is applied to the selected unit capacitor in the case of writing '1'. Voltage, which does not invert the polarity of the selected unit capacitor, is applied to the selected unit capacitor in the case of writing '0', to keep '0' written at the time of reading operation unchanged.

At this time, a prescribed voltage is applied to the unselected unit capacitor to prevent any cross talk at the time of the writing operation.

Now, the method for manufacturing the ferroelectric memory 40 will be described in detail.

For example, the aforesaid ferroelectric memory 40 may be manufactured as follows.

1. The peripheral circuit group 41 is formed by means of a known LSI process (semiconductor process).

Specifically, the MOS transistor 412 is formed on the semiconductor substrate 411.

For example, the element separation region 413 is formed at a prescribed area on the semiconductor substrate 411 by means of a trench separating method or a LOCOS method. Subsequently, the gate insulating layer 412a and the gate electrode 412b are formed. After that, the source/drain region 412c is formed on the semiconductor substrate 411 by doping impurity.

2. The first interlayer insulating layer 414 is formed, and a contact hole is formed. After that, the first wiring layer 43 of a prescribed pattern is formed.

3. The second interlayer insulating layer 415 is formed on the first interlayer insulating layer 414 having the first wiring layer formed thereon.

In this way, the peripheral circuit group 41 having the driving circuits 451 and 452, and the signal detecting circuit 453 is formed.

4. The memory cell array 42 is formed on the peripheral circuit group 41. This step may be carried out in the same manner as the aforesaid steps [1B] to [5B].

5. The first protecting layer 425 is formed on the ferroelectric layer 423 having the second signal electrode 424 formed thereon. Furthermore, a contact hole is formed at a prescribed area on the first protecting layer 425. After that, the second wiring layer 44 of a prescribed pattern is formed, by which the peripheral circuit croup 41 and the memory cell array 42 are electrically connected to each other.

6. The second protecting layer 426 is formed on the uppermost layer.

In this way, the memory cell array 42 is formed, and thus the ferroelectric memory 40 is provided.

The ferroelectric memory 40 is applicable to various electronic apparatuses.

The electronic apparatuses include a personal computer, an IC card, a tag, a cellular phone, etc.

Ink-Jet Recording Head

An ink-jet recording head having the electronic device according to the present invention as the piezoelectric actuator will now be described.

Figure 8:
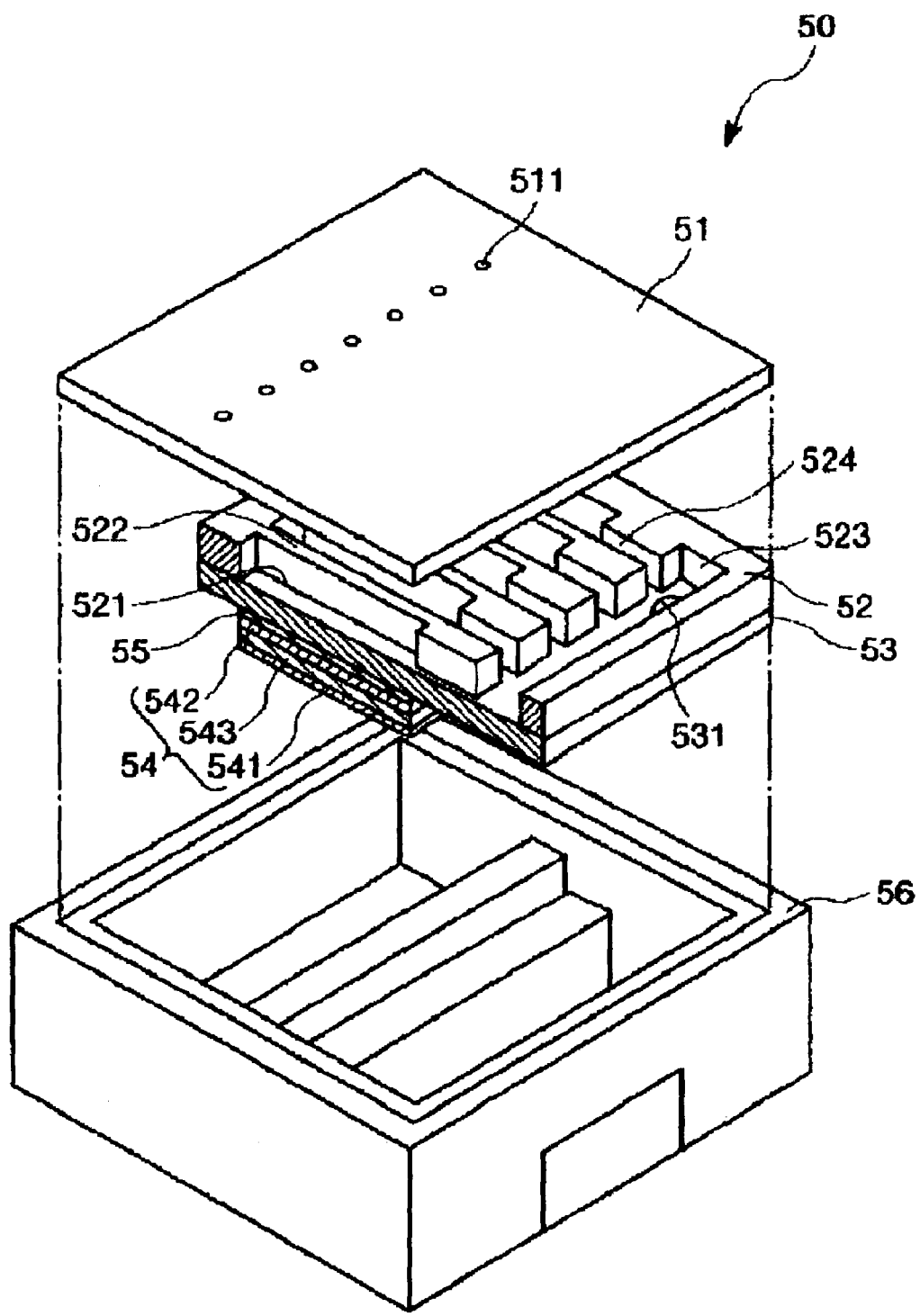
FIG. 8 is an exploded perspective view illustrating a preferred embodiment of an ink-jet recording head according to the present invention.
Figure 9:
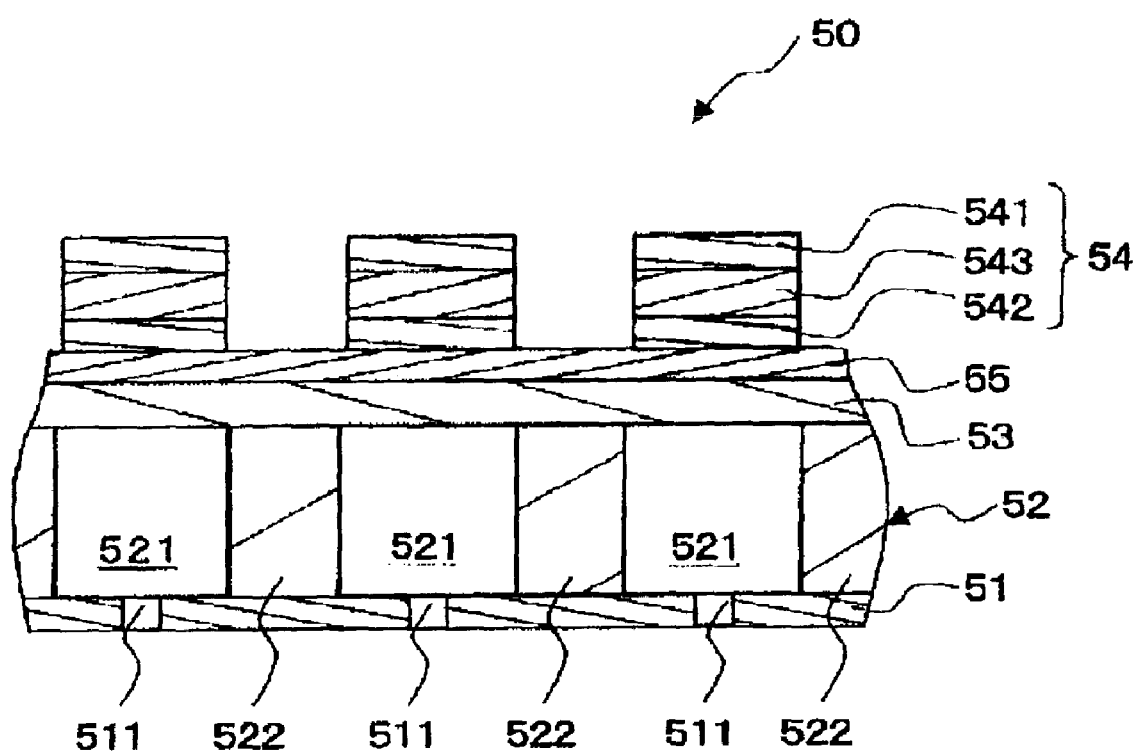
FIG. 9 is a cross sectional view illustrating the structure of select parts of the ink-jet recording head shown in FIG. 8.

FIG. 8 is an exploded perspective view illustrating a preferred embodiment of an ink-jet recording head according to the present invention, and FIG. 9 is a cross sectional view illustrating the structure of select parts of the ink-jet recording head shown in FIG. 8. It should be noted that the ink-jet recording head in FIG. 8 is shown in reverse orientation, i.e., upside down.

As shown in FIG. 8, an ink-jet recording head 50 (hereinafter, referred to as head 50) comprises a nozzle plate 51, ink chamber substrate 52, a vibrating plate 53, and piezoelectric elements (vibrating sources) 54, all of which are disposed in a base 56. The head 50 may be an on-demand type piezo-jet head.

The nozzle plate 51 comprises a (rolled) plate made of stainless steel, for example. Through the nozzle plate 51 are formed a plurality of nozzle holes 511 for discharging ink drops. The pitch between adjacent nozzle holes 511 is set based on the desired printing precision.

The ink chamber substrate 52 is fixedly attached to the nozzle plate 51.

The ink chamber substrate 52 includes a plurality of ink chambers (cavities, pressure chambers) 521 defined by the nozzle plate 51, sidewalls (partitions) 522, and the vibrating plate, which will be described later. The ink chamber substrate 52 further includes a reservoir chamber 523 for temporarily storing the ink supplied from an ink cartridge 631, and a plurality of supplying channels 524 for supplying the ink from the reservoir chamber 523 into the ink chambers 521, respectively.

Each of the ink chambers 521 is formed in the shape of a rectangular parallelepiped, and arranged under the corresponding one of the nozzle holes 511. The volume of each of the ink chambers 521 is varied by means of the vibration of the vibrating plate 53, which will be described later. The ink can be discharged by this variation of the volume of each of the ink chambers.

A basic material for the ink chamber substrate 52 may be, for example, a silicon single crystal substrate, various glass substrates, or various plastic substrates, all of which are general purpose substrates. Therefore, the costs for manufacturing the head 50 may be reduced by using the aforesaid substrates.

Among others, the silicon single crystal substrate of the (110) orientation is preferably used as the basic material for the ink chamber substrate 52. The silicon single crystal substrate of the (110) orientation is suitable for anisotropic etching. Consequently, the ink chamber substrate 52 can be formed easily and reliably.

The average thickness of the ink chamber substrate 52 is preferably about 10 $\mu$m to 100 $\mu$m, and more preferably about 100 $\mu$m to 500 $\mu$m, although it is not particularly limited.

The volume of each of the ink chambers 521 is preferably about 0.1 nL to 100 nL, and more preferably about 0.1 nL to 10 nL, although it is not particularly limited.

The vibrating plate 53 is attached to the ink chamber substrate 52 opposite to the nozzle plate 51, and the piezoelectric elements 54 are attached to the vibrating plate 53 opposite to the ink chamber substrate 52 via a bottom layer (buffer layer) 55.

At a prescribed area of the vibrating plate 53 is formed a through hole 531 penetrating the vibrating plate 53 in the direction of its thickness. The ink is supplied from the ink cartridge 631, which will be described later, into the reservoir chamber 523 through the hole 531.

A piezoelectric body layer 543 is disposed between an upper electrode 541 and a lower electrode 542 to form each of the piezoelectric elements 54. Each of the piezoelectric elements 54 is disposed near the center of each of the ink chambers 521. Each of the piezoelectric elements 54 is electrically connected to a piezoelectric element driving circuit, which will be described later, and operated (for example, vibrated or deformed) based on the signal from the piezoelectric element driving circuit.

Each of the piezoelectric elements 54 serves as a vibrating source. The vibrating plate 53 is vibrated by the vibration of the piezoelectric elements 54 so that the pressure in the ink chambers 521 rises essentially instantaneously.

Base 56 is composed of various resin materials and various metal materials, for example. Inkjet chamber substrate 52 is fixed and supported in the base 56.

In this embodiment, the vibrating plate 53, the bottom layer (buffer layer) 55, the lower electrode 542, the piezoelectric body layer 543, and the upper electrode 541 constitute the aforesaid piezoelectric actuator 300.

In this embodiment, therefore, at least the surface of the vibrating plate 53 is made of amorphous material.

In case that a prescribed discharge signal is not input via the piezoelectric element driving circuit, i.e., that voltage is not applied between the lower electrode 542 and the upper electrode 541 of the piezoelectric element 54, the piezoelectric body layer 543 of the head 50 is not deformed. As a result, the vibrating plate 53 is not also deformed, and thus the volume of the ink chamber 521 is not varied. Consequently, no ink drop is discharged through the nozzle holes 511.

On the other hand, in case that a prescribed discharge signal is input via the piezoelectric element driving circuit, i.e., that a prescribed voltage is applied between the lower electrode 542 and the upper electrode 541 of the piezoelectric element 54, the piezoelectric body layer 543 of the head 50 is bent severely. As a result, the vibrating plate 53 is deformed, and thus the volume of the ink chamber 521 rises essentially instantaneously. Consequently, the ink drop is discharged through the nozzle holes 511.

Once the ink is discharged, if the voltage applied between the lower electrode 542 and the upper electrode 541 is interrupted by the piezoelectric element driving circuit, by which the piezoelectric elements 54 restore their original shapes, the volume of each of the ink chambers 521 is increased. At this time, the pressure acting from the ink cartridge 631, which will be described later, to the nozzle holes 511 (pressure applied in the forward direction) is applied to the ink. As a result, air does not enter the ink chambers 521 through the nozzle holes 511, and an amount of the ink corresponding to the discharged amount of the ink is supplied from the ink cartridge 631 (reservoir chamber 523) into the ink chambers 521.

In this way, the discharge signals are input in regular sequence to the piezoelectric element 54 of the head 50 at the position where printing is desired via the piezoelectric element driving circuit, with the result that any desired letters or figures can be printed.

Now, one example of the method for manufacturing the head 50 will be described.

For example, the head 50 may be manufactured as follows.

10. A basic material, from which the ink chamber substrate 52 is made, is integrally attached to the vibrating plate 53.

For example, the basic material may be integrally attached to the vibrating plate 53 by heating the basic material and the vibrating plate 53 while the basic material is pressed against the vibrating plate 53. According to the aforesaid heat treatment, the basic material can be integrally attached to the vibrating plate 53 easily and reliably.

The condition for heat treatment is preferably 100 to 600° C. and 1 to 24 hours, and more preferably 300 to 600° C. and 6 to 12 hours, although it is not particularly limited.

Other different bonding or welding methods may be used to attach the basic material to the vibrating plate 53.

20. The piezoelectric elements 54 are formed on the vibrating plate 53 via the bottom layer 55.

This forming step may be carried out in the same way as the aforesaid steps [1C] to [5C].

30. Depressed portions constituting the ink chambers 521 are formed on the basic material, from which the ink chamber substrate 52 is made, at the positions corresponding to the piezoelectric elements 54, respectively. Also, other depressed portions constituting the reservoir chamber 523 and the supplying channels 524 are formed on the basic material at prescribed positions, respectively.

Specifically, a mask layer is formed at the position where the ink chambers 521, the reservoir chamber 523, and the supplying channels 524 are to be formed. After that, one of the following etching is carried out on the mask layer: dry etching, such as parallel plate type reactive ion etching, inductive coupling etching, electrocyclotron resonance etching, helicon wave exciting etching, magnetron etching, plasma etching, ion beam etching, or wet etching with highly concentrated alkali aqueous solution, such as 5 to 40 wt % of potassium hydroxide or tetramethylammonium hydroxide.

By etching, the basic material is removed to the extent that the vibrating plate 53 is exposed on the basic material in the direction of its thickness, with the result that the ink chamber substrate 52 is formed. At this time, the remaining portions, which are not etched, constitute the sidewalls 522. The exposed vibrating plate 53 is ready to serve as the vibrating plate.

In case that the silicon substrate of the (110) orientation is used as the basic material, the basic material is easily subjected to the anisotropic etching using the aforesaid highly concentrated alkali aqueous solution. Consequently, the ink chamber substrate 52 can be formed easily.

40. The nozzle plate 51 having a plurality of the nozzle holes 511 formed therethrough is disposed on the ink chamber substrate 52 in such a manner that the nozzle holes 511 mate with the corresponding depressed portions constituting the ink chambers 521, respectively. As a result, a plurality of the ink chambers 521, the reservoir chamber 523, and a plurality of the supplying channels 524 are formed in such a manner that they are separated from one another.

The attaching may employ various bonding methods, such as adhesion by adhesives, or various welding methods.

50. The ink chamber substrate 52 is attached to the base 56.

By the steps as described above, the ink-jet recording head 50 is provided.

Ink-Jet Printer

An ink-jet printer having the ink-jet recording head according to the present invention will now be described.

Figure 10:
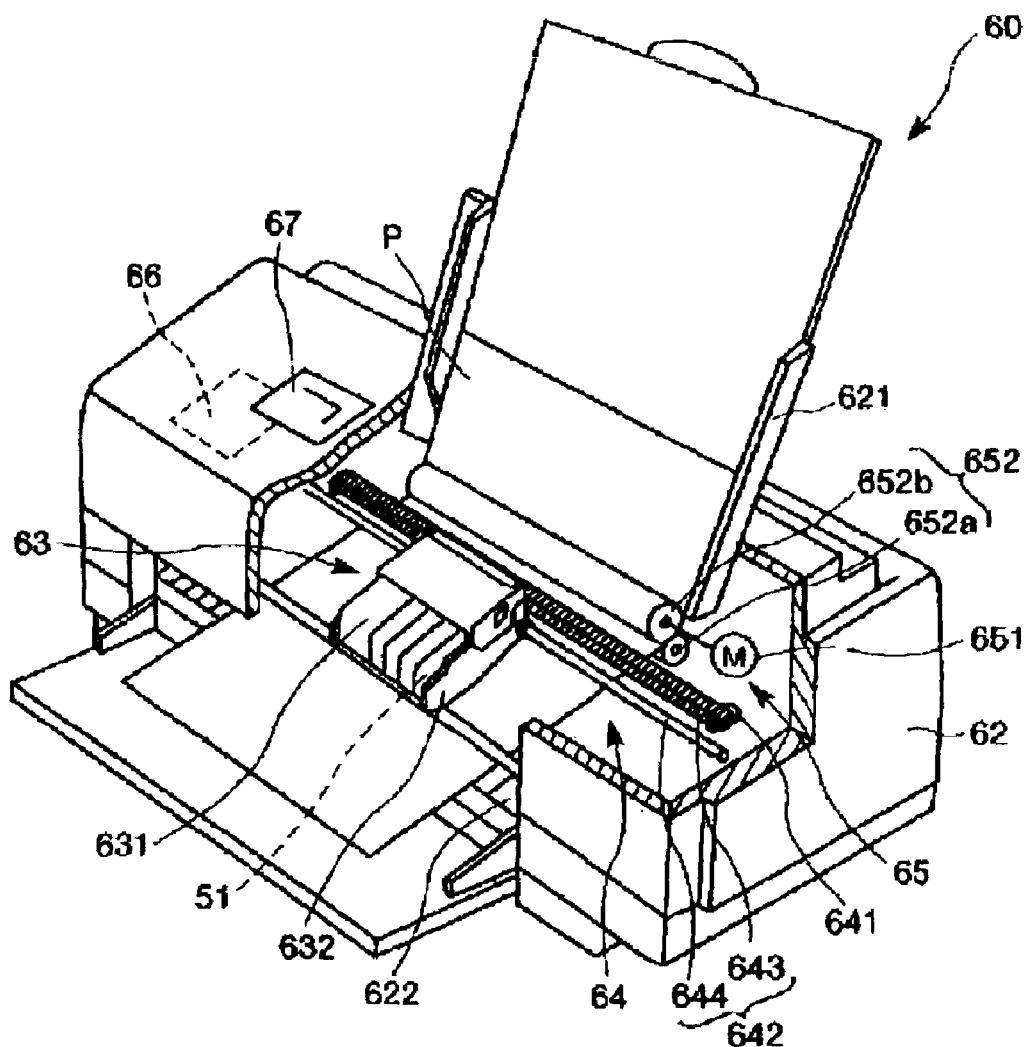
FIG. 10 is a diagrammatic view illustrating a preferred embodiment of an ink-jet printer according to the present invention.

FIG. 10 is a diagrammatic view illustrating a preferred embodiment of an ink-jet printer according to the present invention.

In the following description, the upper side of FIG. 10 is referred to as the upper part, and the lower side as the lower part.

As shown in FIG. 10, the ink-jet printer 60 comprises a printer body 62, a tray 621 disposed at the upper rear part of the printer body 62 for supplying printing papers P, a paper discharging section 622 formed at the lower front part of the printer body 62 for discharging the printing papers P, and a control panel 67 provided on the printer body 62.

The control panel 67 may be realized, for example, by a liquid crystal display, an organic EL display, or a LED lamp. The control panel 67 comprises a display part for displaying error messages (not shown) and a control part including various kinds of switches (not shown).

In the printer body 62 are mounted a printing apparatus (printing means) 64 having a reciprocating head unit 63, a feeder (feeding means) 65 for feeding the printing papers P sheet by sheet to the printing apparatus 64, and a controller (controlling means) 66 for controlling the printing apparatus 64 and the feeder 65.

By control of the controller 66, the feeder 65 intermittently feeds the printing papers P sheet by sheet. The printing papers P pass near the lower part of the head unit 63. At this time, the head unit 63 is reciprocated perpendicularly to the direction of feeding the printing papers P so that the printing operation is carried out on the printing papers P. Specifically, the reciprocating of the head unit 63 and the intermittent feeding of the printing papers P indicates scanning and feeding operations in the printing process, respectively. In this way, the ink-jet printing operation is accomplished.

The printing apparatus 64 comprises the head unit 63, a carriage motor 641 for driving the head unit 63, and a reciprocating mechanism 642 for moving the head unit 63 from side to side when the carriage motor 641 is rotated.

The head unit 63 comprises an ink-jet recording head 50 having a plurality of nozzle holes 511 formed at the lower part thereof, an ink cartridge 631 for supplying ink to the ink-jet recording head 50, and a carriage 632 for holding the ink-jet recording head 50 and the ink cartridge 631.

The ink cartridge 631 preferably contains four colors of ink, such as yellow, cyan, magenta, and black, therein, to carry out full color printing. In this case, a plurality of ink-jet recording heads 50 for providing the colors, the structures of which will be described later, are mounted in the head unit 63.

The reciprocating mechanism 642 comprises a carriage guide shaft 643 having both ends supported by a frame (not shown), and a timing belt 644 disposed in parallel with the carriage guide shaft 643.

The carriage 632 is supported by the carriage guide shaft 643 in such a way that the carriage 632 can be reciprocated. Furthermore, the carriage 632 is fixedly attached to a part of the timing belt 644.

If the timing belt 644 travels in the forward and reverse directions via a pulley by the operation of the carriage motor 641, the head unit 63 is reciprocated while being guided by the carriage guide shaft 643. During this reciprocation of the head unit 63, a suitable amount of the ink is discharged from the ink-jet recording head 50 so that the printing operation is carried out on the printing papers P.

The feeder 65 comprises a feeding motor 651 and a feeding roller 652 rotated by the operation of the feeding motor 651.

The feeding roller 652 comprises a driven roller 652a and a driving roller 652b, which are disposed opposite to each other. The feeding passage of the printing papers P is defined between the driven roller 652a and the driving roller 652b, i.e., the printing papers pass between the driven roller 652a and the driving roller 652b. The driving roller 652b is connected to the feeding motor 651. Consequently, the feeding roller 652 can feed the printing papers P received in the tray 621 sheet by sheet toward the printing apparatus 64. Instead of the tray 621, a feeding cassette for storing the printing papers P may be mounted detachably in the printer body 62.

The controller 66 controls the printing apparatus 64 and the feeder 65 based on information inputted from a host computer, such as a personal computer or a digital camera, to carry out the printing operation.

The controller 66 comprises a memory for storing control programs for controlling the parts of the printer, a piezoelectric element driving circuit for controlling timing of ink discharge by driving the piezoelectric elements (vibrating sources) 54, a driving circuit for driving the printing apparatus (carriage motor 641), a driving circuit for driving the feeder 65 (the feeding motor 651), a communicating circuit for receiving printing data from the host computer, and a CPU electrically connected to the above components for controlling them, none of which are shown.

Various sensors are electrically connected to the CPU for sensing various printing environments, such as residual amount of the ink in the ink cartridge 631, and position, temperature and humidity of the head unit 63, respectively.

The controller 66 receives the printing data via the communicating circuit to input it to the memory. The CPU processes the printing data, and outputs driving signals to the driving circuits based on the processed data and the data inputted from the sensors By means of the driving signals, the piezoelectric elements 54, the printing apparatus 64 and the feeder 65 are operated, respectively. Consequently, the printing operation is carried out on the printing papers P.

Although the board for the electronic device, the electronic device, the ferroelectric memory, the electronic apparatus, the inkjet recording head, and the ink-jet printer have been described on the basis of the preferred embodiments with reference to the drawings, the present invention is not limited to the aforesaid embodiments.

For example, various modifications, additions and substitutions to the parts constituting the board for the electronic device, the electronic device, the ferroelectric memory, the electronic apparatus, the inkjet recording head, and the ink-jet printer are possible.

Furthermore, additional steps may be added in the method for manufacturing the board for the electronic device, the electronic device, the ferroelectric memory, and the ink-jet recording head.

Moreover, any liquid discharging mechanism of various industrial liquid discharging apparatuses may be applied to the ink-jet recording head according to the aforesaid preferred embodiment of the present invention. In this case, it is possible to use any liquid or liquid state substance having viscosity suitable to be discharged from nozzles (liquid discharging holes) of the liquid discharging mechanism in the liquid discharging apparatus, in addition to the aforesaid ink (colored ink of yellow, cyan, magenta, and black).

Effects of the Invention

As apparent from the above description, the present invention provides a board for an electronic device comprising a substrate at least having a surface made of an amorphous substance, a buffer layer formed on the surface of the substrate, the buffer layer having an orientation at least in the direction of its thickness, and a conductive oxide layer formed on the buffer layer by means of epitaxial growth, the conductive oxide layer having a metal oxide of a perovskite structure, whereby the electronic device with various excellent characteristics can be realized in the most suitable structure.

Furthermore, any of various general purpose boards may be used as the board of the. electronic device according to the present invention, whereby the costs for manufacturing the board for the electronic device can be reduced.

Moreover, in case that the conductive oxide layer is formed by properly selecting a material for the buffer layer, not only the efficiency of forming the conductive layer can be improved, but also the adhesive property between the substrate and the conductive oxide layer can be improved.

The entire disclosure of Japanese Patent Application Nos. 2002-84327 filed Mar. 25, 2002 and 2003-44370 filed Feb. 21, 2003 are incorporated by reference.

What is claimed is:

1. An ink-jet recording head comprising:
a piezoelectric actuator, the piezoelectric actuator comprising:
a substrate having at least a surface of an amorphous substance;
a buffer layer on the amorphous substance, the buffer layer having an orientation at least in a thickness direction of the buffer layer; and
an epitaxial conductive oxide layer above the buffer layer, the conductive oxide layer including a metal oxide of a perovskite structure.

2. The ink-jet recording head according to claim 1, wherein the buffer layer has an orientation in all three-dimensional directions.

3. The ink-jet recording head according to claim 1, wherein the buffer layer further comprises an epitaxial buffer layer having at least one of a cubic crystal (100) orientation, a cubic crystal (110) orientation, and a cubic (111) orientation.

4. The ink-jet recording head according to claim 1, wherein the buffer layer contains at least one of a group consisting of a metal oxide of a NaCl structure and a metal oxide of a fluorite structure.

5. The ink-jet recording head according to claim 4, wherein the metal oxide of the NaCl structure comprises at least one of the group consisting of MgO, CaO, SrO, and BaO, or a solid solution containing MgO, CaO, SrO, or BaO.

6. The ink-jet recording head according to claim 4, wherein the metal oxide of the fluorite structure comprises at least one of the group consisting of yttria-stabilized zirconia, $CeO_2$, and $ZrO_2$, or a solid solution containing yttria-stabilized zirconia, $CeO_2$ or $ZrO_2$.

7. The ink-jet recording head according to claim 1, wherein the epitaxial conductive oxide layer has one of a pseudo cubic crystal (100) orientation and a pseudo cubic crystal (110) orientation.

8. The ink-jet recording head according to claim 1, wherein the metal oxide of the perovskite structure comprises at least one of the group consisting of $CaRuO_3$, $SrRuO_3$, and $BaRuO_3$, or a solid solution containing $CaRuO_3$, $SrRuO_3$, or $BaRuO_3$.

9. An ink-jet printer comprising:
an ink-jet recording head, the ink-jet recording head comprising a piezoelectric actuator;
the piezoelectric actuator further comprising:
a substrate having at least a surface of an amorphous substance;
a buffer layer on the amorphous substance, the buffer having an orientation at least in a thickness direction of the buffer layer; and
an epitaxial conductive oxide layer above the buffer layer, the conductive oxide layer comprising a metal oxide of a perovskite structure.

10. The ink-jet printer according to claim 9, wherein the buffer layer has an orientation in all three-dimensional directions.

11. The ink-jet printer according to claim 9, wherein the buffer layer further comprises an epitaxial buffer layer having one of a cubic crystal (100) orientation, a cubic crystal (110) orientation, and a cubic crystal (111) orientation.

12. The ink-jet printer according to claim 9, wherein the buffer layer contains at least one of a group consisting of a metal oxide of a NaCl structure and a metal oxide of a fluorite structure.

13. The ink-jet printer according to claim 12, wherein the metal oxide of the NaCl structure comprises at least one of the group consisting of MgO, GaO, SrO, and BaO, or a solid solution containing MgO, GaO, SrO, or BaO.

14. The ink-jet printer according to claim 12, wherein the metal oxide of the fluorite structure comprises at least one of the group consisting of yttria-stabilized zirconia, $CeO_2$, and $ZrO_2$, or a solid solution containing yttria-stabilized zirconia, $CeO_2$, or $ZrO_2$.

15. The ink-jet printer according to claim 9, wherein the metal oxide of the perovskite structure comprises at least one of a pseudo cubic crystal (100) orientation and pseudo cubic crystal (110) orientation.

16. The ink-jet printer according to claim 9, wherein the metal oxide of the perovskite structure comprises at least one of the group consisting of $CaRuO_3$, $SrRuO_3$, and $BaRuO_3$, or a solid solution containing $CaRuO_3$, $SrRuO_3$, or $BaRuO_3$.

* * * * *